United States Patent [19]

Baker et al.

[11] Patent Number: 5,802,116

[45] Date of Patent: Sep. 1, 1998

[54] SOFT DECISION VITERBI DECODING WITH LARGE CONSTRAINT LENGTHS

[75] Inventors: Thomas W. Baker, North Whitehall Township, Pa.; Mohammed S. Mobin, Old Bridge, N.J.

[73] Assignee: Lucent Technologies Inc., Murray Hill, N.J.

[21] Appl. No.: 628,072

[22] Filed: Apr. 4, 1996

[51] Int. Cl.[6] .......................... G06F 11/10; H03M 13/12
[52] U.S. Cl. ............................................. 375/341; 371/43.7
[58] Field of Search .......................... 375/341; 371/43.6, 371/43.7, 43.8

[56] References Cited

U.S. PATENT DOCUMENTS

| 5,099,499 | 3/1992 | Hammar | 375/341 |
|---|---|---|---|
| 5,181,209 | 1/1993 | Hagenauer et al. | 371/43.7 |
| 5,406,570 | 4/1995 | Berrou et al. | 371/43.4 |
| 5,414,738 | 5/1995 | Bienz | 375/341 |
| 5,432,804 | 7/1995 | Diamondstein et al. | 371/43.7 |
| 5,454,014 | 9/1995 | Blaker et al. | 375/341 |
| 5,465,275 | 11/1995 | Blaker et al. | 375/341 |
| 5,471,500 | 11/1995 | Blaker et al. | 375/340 |
| 5,537,444 | 7/1996 | Nill et al. | 375/341 |
| 5,550,870 | 8/1996 | Blaker et al. | 375/341 |
| 5,581,568 | 12/1996 | Togami | 371/43.7 |

OTHER PUBLICATIONS

Peyton Z. Peebles, Jr., *Digital Communication Systems*, pp. 87–102.

M. Morris Mano, *Computer Engineering Hardware Design*, pp. 11–17 (1988).

Giovanna D'Aria et al., *Simulation and Performance of the Pan European Land Mobile Radio System*, in IEEE Transactions On Vehicular Technology, vol. 41, No. 2 (May 1992).

Renato D'Avella et al., *An Adaptive MLSE Receiver for TDMA Digital Mobile Radio*, in IEEE Journal On Selected Areas In Communications, vol. 7, No. 1, (Jan. 1989).

G. David Forney, Jr., *The Viterbi Algorithm*, in Proceedings of the IEEE, vol. 61, No.3 (Mar. 1973).

Joachim Hagenauer and Peter Hoeher, *A Viterbi Algorithm with Soft-Decision Outputs and its Applications*, In IEEE Global Telecommunications Conf. & Exhibition, vol. 3, pp. 1680–1686 (1989).

Wern-Ho Sheen and Gordon L. Stuber, *MLSE Equilization and Dedocing for Multipath-Fading Channels*, in IEEE Transactions On Communications, vol. 39. No. 10 (Oct. 1991).

Kazuhiko Fukawa and Hiroshi Suzuki, *Adaptive Equalization With RLS-MLSE For Frequency-Selective Fast Fading Mobile Radio Channel*, in IEEE Global Telecommunications Conf., vol. 1, (Dec. 1991).

Primary Examiner—Stephen Chin
Assistant Examiner—Jeffrey W. Gluck

[57] ABSTRACT

A method and apparatus for obtaining a soft symbol decoded output of a received signal by a two pass Viterbi operation. The technique is especially advantageous where the signal is convolutionally encoded with large constraint lengths. During the first pass, the error-correction co-processor (ECCP) is programmed for hard decoded output alone. After all the received symbol sets are hard-bit decoded, a second pass Viterbi operation is performed. Using the previously decoded hard bit to identify the most likely next state at an initial time instant, and initializing the present states at that initial time instant with pre-saved accumulated costs from the first pass Viterbi operation, branch metrics are computed for those state transitions leading to the most likely next state at that time instant. The accumulated cost values of the present states leading to the most likely next state are updated, and the absolute value of their difference is coded as a reliability of the hard decoded output corresponding to that time instant. The combination of the hard decoded output and the reliability obtained from the second pass Viterbi operation results in a soft symbol decoded output. At this point, the symbol set received at this time instant during the first pass Viterbi operation is reloaded into the ECCP which updates the accumulated cost values of all possible next states. These steps are repeated until all desired soft symbols are obtained.

17 Claims, 5 Drawing Sheets

SOFT DECISION VITERBI DECODING WITH LARGE CONSTRAINT LENGTHS

FIELD OF THE INVENTION

The present invention relates generally to decoding a digital signal. In particular, the subject method and circuit provide a soft symbol decoded output, and are particularly advantageous when implemented to decode convolutionally encoded signals with large constraint lengths.

BACKGROUND OF THE INVENTION

In digital signal applications, source signals are often encoded prior to transmission in order to maximize correction and detection of the transmitted signal from noise and other sources of distortion. Where a digital signal is convolutionally encoded, one receiver implementation uses a Viterbi decoder to detect the original source signal.

A convolutional encoder comprises a number of shift registers and modulo-2 adders to convert a set of one or more input bits of a source signal, into a second set of bits for transmission. By transmitting a set of bits having more bits than the input set of bits, the receiver has additional bits from which to detect the information inherent in the source signal. Thus, the convolutional encoder is said to add an element of redundancy to the source signal. The ratio of input bits to output bits is referred to as the code rate. The number of shift registers is referred to as the constraint length. For example, an encoder with two shift registers capable of receiving one bit at each discrete time period from the source signal and whose output is two bits, has a code rate of one half and a constraint length of two. Convolutional encoding is more fully described in Peyton Z. Peebles, Jr., *Digital Communications Systems* pp. 87-102 (Prentice Hall, 1987), hereby incorporated by reference as if fully set forth herein.

A Viterbi decoder is so named due to its implementation of the Viterbi algorithm to decode a received digital signal. Typically, a receiver first detects a signal and divides it into a sequence of symbol sets. Each set comprises a number of bits equal to the number of output bits from the convolutional encoder. Thus for a rate one half encoder, the symbol set comprises two bits, also referred to as a di-bit. The symbol sets are then input to a decoder at discrete time instants.

The premise of the Viterbi decoder is that for each received symbol set, at a given time instant, there exists a finite number of states to represent the corresponding source signal bit(s). The number of states is a function of the constraint length of the convolutional encoder. Specifically, the number of states equals $2^{C-1}$, where C is the constraint length. Although large constraint lengths are often desirable for better encoding, the result is that the Viterbi decoder requires larger memory resources. For example, where the constraint length is three and one source signal bit is input at one time into the convolutional encoder, there are four possible states at any time instant to represent the transmitted source signal bit. Where the constraint length is increased to five, the number of possible states at any time instant increases to sixteen.

At each time instant, a symbol set is received and the Viterbi decoder maps all possible transitions between the finite number of states. Each transition reflects a possible source signal corresponding to the received signal at that time instant. These transitions are referred to as branches. The origin state of each transition is referred to as a present state and the ending state of each transition is referred to as a next state. For a sequence of symbol sets, the Viterbi decoder generates one or more possible sequences of state transitions, each of which forms a path.

For each transition from present state to next state, the Viterbi decoder, which knows the code for the convolutional encoder, can generate a corresponding set of bits reflecting the transmitted signal. Since each branch has a corresponding generated set of bits, consider a set of two bits ("di-bit") for purposes of illustration, an error can be computed, referred to as a branch metric, between the generated di-bit and the received symbol set. Consequently, each next state can be associated with an error, referred to as an accumulated cost value, equal to the sum of the branch metric from a particular present state to a particular next state and the accumulated cost of the present state. Likewise, an accumulated cost value can be associated with each path. The Viterbi decoder compares alternative paths and selects the path with an extremum error typically the smallest representative of the source signal.

Figure 1:
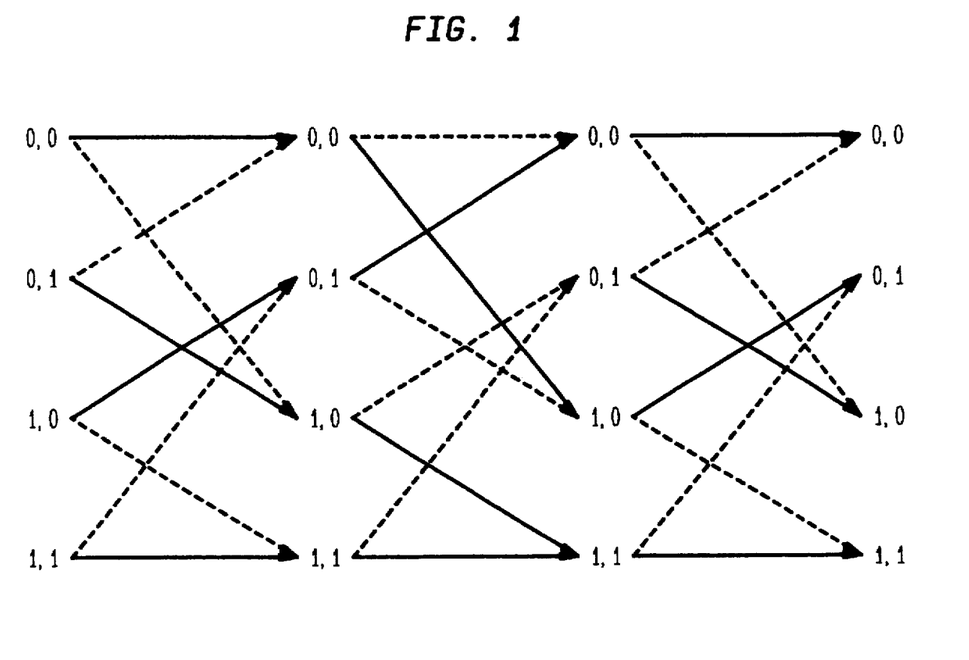
FIG. 1 is a trellis diagram illustrating the add-compare-select operation of a Viterbi decoder.

The add-compare-select operation of a Viterbi decoder can be shown with the aid of a trellis diagram as in FIG. 1. The trellis diagram of FIG. 1 assumes a one half code rate and a constraint length of three. At any time instant, the transmitted pairs of bits can match one of four possible states: 0,0; 0,1; 1,0; or 1,1. As the first symbol set is received at time instant $t_0$, the Viterbi decoder recognizes that the single source signal bit which lead to the received symbol set could be either a 0 or a 1. Thus starting from 0,0 dropping the least significant digit and adding either a zero or a one to the most significant digit, the 0,0 state can proceed either to another 0,0 state reflecting a zero source bit, or to a 1,0 state reflecting a one source bit. Similar transitions can be shown from 0,1; 1,0; and 1,1. Since for each present state at each time instant, one of the two possible transitions is more likely than the other, FIG. 1 indicates the more likely transition with a solid line and the less likely transition with a dashed line.

Knowing the convolutional encoder scheme and that the present state is 0,0, the Viterbi decoder can generate a simulation of the transmitted symbol set assuming the source bit was 0 and a simulation of the transmitted symbol set assuming the source bit was 1. For a one half code rate the Viterbi decoder will generate two bits for each transition. By computing an error between the two generated bits at each branch and the received two bits at that time instant, the Viterbi decoder can obtain a branch metric for each branch. In some metric schemes the error is measured by the difference in value between the generated bits and their corresponding received signal set. It is readily seen that for the encoder scheme illustrated here, each next state is reached by one of two branches. Other encoder schemes may result in each next state being connected to four or eight branches. For each next state at each time instant, the Viterbi decoder selects the branch with an extremum error, typically the smallest. However, until all symbol sets are received, the decoder does not know which of the least error transitions at any one time instant will ultimately lie in the path having the smallest accumulated error.

At time instant $t_1$, the second symbol set is received and the Viterbi decoder again generates a di-bit and calculates a corresponding branch metric for each of the possible transitions from the present states to the next states. This proceeds until all the symbol sets are received, at which point the path with the least error, shown by a sequence of solid transitions, is selected as the path which most likely represents the source signal.

The Viterbi decoder described above translates each symbol set into a hard bit, i.e., a 1 or 0. As described more fully in U.S. Pat. No. 5,471,500 entitled "Soft-Symbol Decoding," which issued to Blaker on Nov. 28, 1995 and is commonly assigned with the present application, hereby incorporated by reference as if fully set forth herein, accurate decoding of a transmitted signal is enhanced with soft-symbol decoding. Soft-symbol decoding refers to decoding a signal into a zero or a one hard bit, and a symbol which indicates a level of confidence that the decoded hard bit accurately represents the source bit. For instance, a received signal having an analog value of 0.9 is likely to be quantized into a hard decision one. Indeed, the likelihood that the 0.9 is accurately reflected as a one is great. Likewise, an analog value of 0.1 is likely to be quantized as a hard zero. Again, the probability is great that this quantization is correct. However, when the received signal is 0.5, the level of confidence that the signal was transmitted as a zero or a one is very low. A soft symbol decoded output is a concatenated symbol, comprising the hard bit followed by the corresponding branch metric, or another series of bits corresponding to the branch metric, to indicate the reliability of the decoded hard bit. The method of the above referenced patent uses the absolute value of the accumulated cost difference between the two transitions leading to the most likely next state corresponding to the hard decoded bit as a soft confidence measure and for deriving the final soft symbol.

Since the branch metrics of both transitions to a particular next state are required for the soft confidence described above and the correct path is not known a priori, the Viterbi decoder must store in memory the hard bits associated with soft confidence for each surviving transition at each time instant until the correct path is identified. Since larger constraint lengths involve more transitions at each time instant, soft symbol decoding requires large memory capacity. Thus, the advantage of soft decision Viterbi decoders cannot be realized where the necessary memory resources are so large as to be impractical to implement.

SUMMARY OF THE INVENTION

The present invention provides a cost effective method and circuit for soft symbol viterbi decoding for large constraint lengths. A received sequence of symbol sets are decoded in two steps, referred to as two passes. In the first pass, a Viterbi decoder provides a hard decoded output of the received symbol sets. After completing the first pass Viterbi operation, a Viterbi decoder is initialized with the accumulated cost values of each state at one time instant prior to receiving the first digital signal of interest for soft symbol decoding. The hard decoded output of the first pass is input to the Viterbi decoder of the second pass from which the most likely next state at the first time instant of interest can be identified. The Viterbi decoder identifies the two state transitions having the least errors using the hard decision bits decoded in the first pass, and calculates their respective branch metrics and the accumulated cost difference between these two branches. The absolute value of the accumulated cost difference is then coded as a reliability of the hard bit at that first time instant. The combination of the hard bit and reliability is provided as a soft symbol output. The received symbol set of the first time instant of interest is then input to the second pass Viterbi decoder, which generates bits for each possible state transition, calculates branch metrics for each branch and updates the accumulated cost values for each of the next states. This process continues until a reliability for each hard bit is obtained.

DETAILED DESCRIPTION OF THE INVENTION

Figure 2:
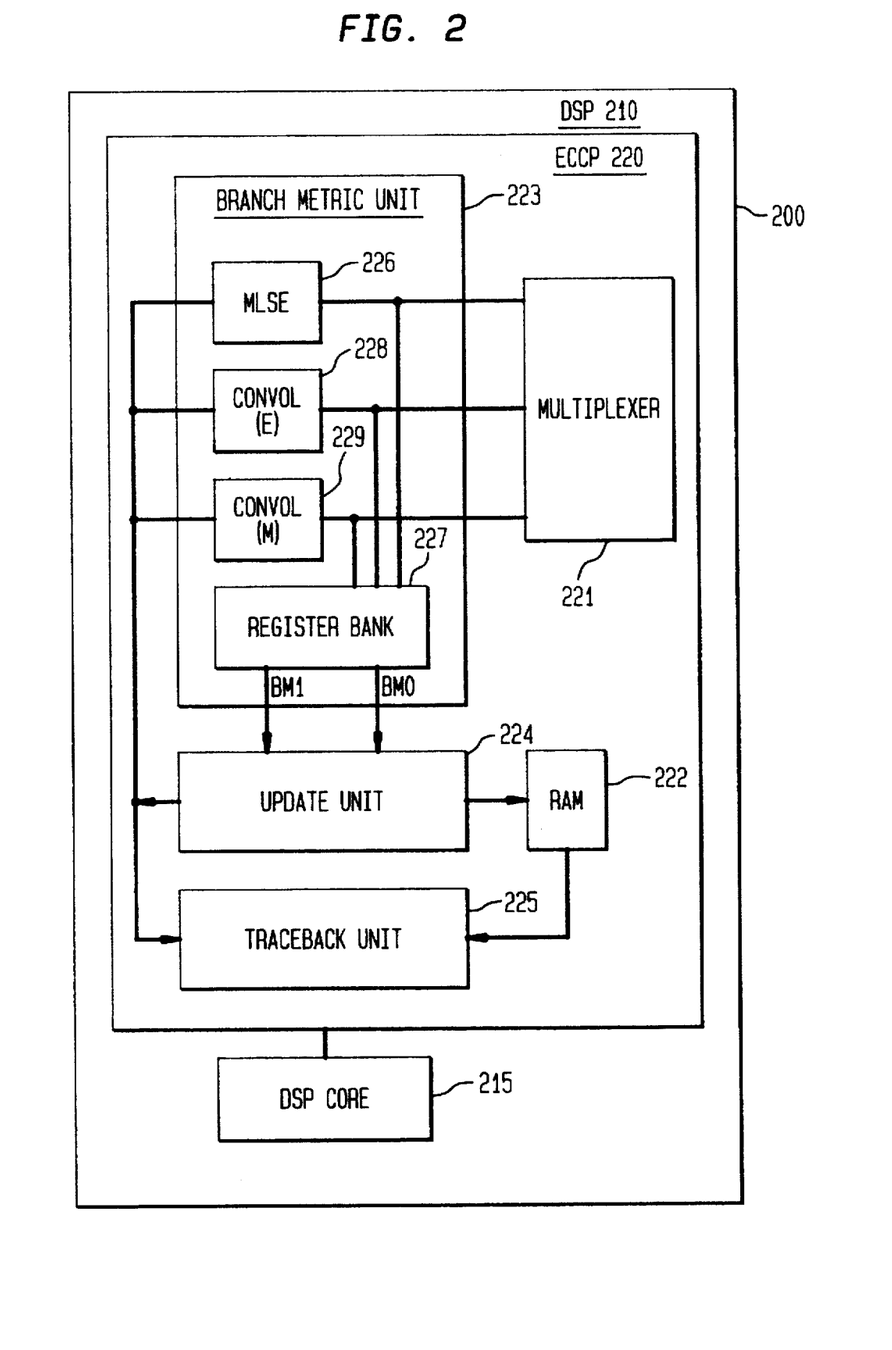
FIG. 2 is a block diagram of a receiver of the present invention.

The present invention as described below, has useful application in communication systems, such as earth to satellite communications and digital cellular telephony between a cellular telephone and a base station. Referring to FIG. 2, one advantageous embodiment of a receiver (200) is shown, which employs a Viterbi decoder comprising a digital signal processor ("DSP") (210) having an error correcting co-processor (ECCP) (220) and a DSP core (215). Alternatively, a receiver can implement the present invention with a DSP alone. A dedicated error correcting co-processor results in a more efficient decoding operation, but it is not a critical component. DSP core (215) sets the operational parameters of the ECCP (220) such as constraint length, and branch metric type and initiates the Viterbi decoding performed by ECCP (220). The ECCP contains an update unit (224), a trace back unit (225) and a branch metric unit (223). The branch metric unit (223) calculates the branch metric for each transition from a present state to a next state. A variety of metrics have been proposed by those skilled in the art for comparatively evaluating individual branches on the trellis. Viterbi decoders which utilize branch metric units may be capable of performing the Viterbi process utilizing a variety of metrics. The update unit (224) performs the add-compare-select operation of the viterbi algorithm. Since the path which will ultimately prove to have the smallest error is unknown a priori, the receiver cannot select one decoded bit from amongst the alternative paths. So as to conserve memory resources and avoid storing all the possible hard bits at each time instant, trace back unit (225) traces the best path beginning at a time instant at which there is sufficient confidence that the best path can be accurately identified, to retrieve the decoded hard bits associated with the best path. Therefore, it is only necessary to store the accumulated cost for each path in random access memory ("RAM") (222).

Figure 3:
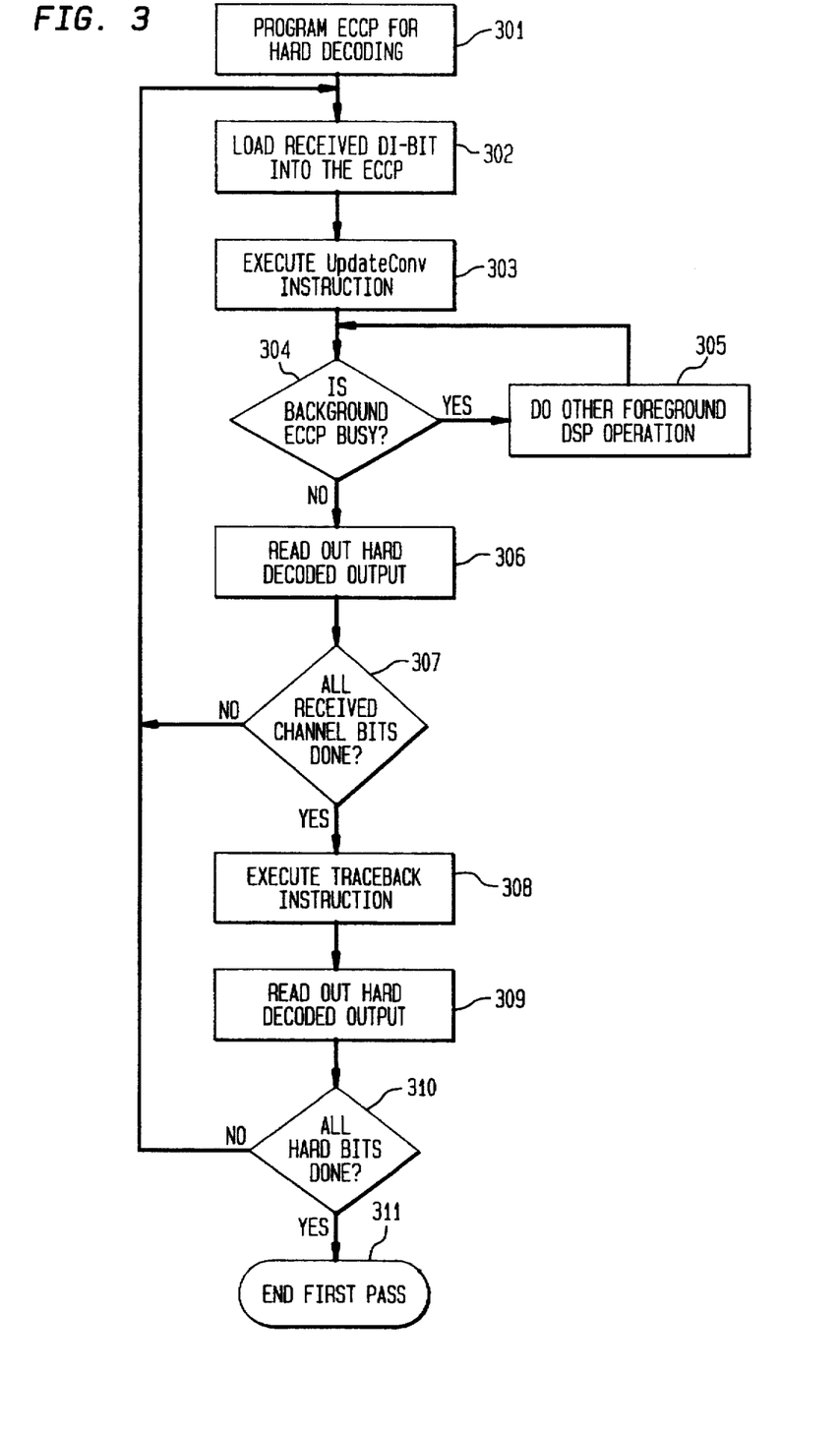
FIG. 3 is a flow chart of the first pass Viterbi operation of the present invention.

Referring to FIG. 3, block (301) indicates that for the first pass Viterbi operation of the present invention, ECCP (220) is initially set for hard decoded output. In block (302), a received channel symbol set is loaded into ECCP (220). ECCP (220) then executes a single update convolutional decoding instruction which includes adding the accumulated cost of the present state to the branch metric of a transition from the present state to a next state for each possible next state, comparing the updated accumulated costs of the branches to each next state, and selecting the branch whose accumulated cost indicates a smaller error. This is shown in block (303).

During the foregoing add-compare-select operation, ECCP (220) is set into background operation mode. Meanwhile, DSP (210) performs other signal processing activities. After ECCP (220) completes its add-compare-select operation, it issues an interrupt to DSP core (215). Alternatively, DSP (210) may poll an ECCP busy flag to determine when ECCP (220) completes its add-compare-select operation and a simultaneous parallel traceback decoding. The simultaneous traceback only occurs from a time instant where there is sufficient confidence that the best path can be accurately detected to a point in time when all the symbol sets have been received. This is shown in blocks (304) and (305). A hard decoded output of each received symbol set is read-out in block (306) to DSP RAM (222). The steps involved in blocks (302) through (306) are repeated until all the received symbol sets are decoded, as shown in block (307).

After all the received symbol sets are decoded, ECCP (220) performs a traceback operation, as shown in block (308), on those decoded hard bits which were not subject to the simultaneous traceback of ECCP (220). The traceback operation allows ECCP (220) to decode the received symbol sets without having to save the hard bits associated with each state transition. After the path with the least error is identified, i.e., all the received symbols are decoded, the traceback operation of block (308), traces the branches which form the best path and saves the corresponding hard bits.

After the trace-back operation is complete, the hard bits comprising the decoded output are provided to ECCP for further processing as shown in block (309). In block (310), ECCP (220) identifies when the last decoded bit is received. This concludes the first pass of the Viterbi operation of the present invention.

Figure 4:
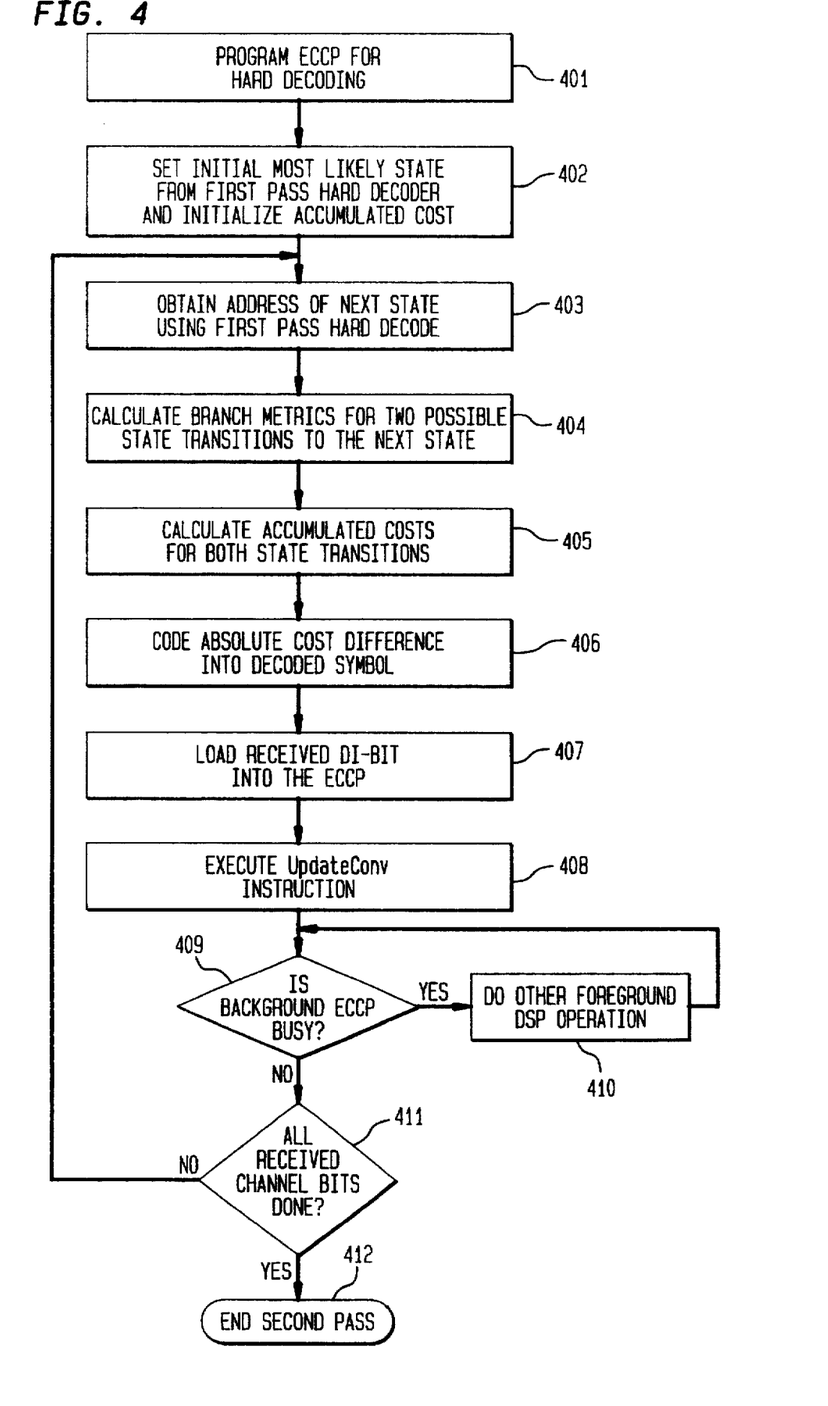
FIG. 4 is a flow chart of the second pass Viterbi operation of the present invention.

Referring to FIG. 4, at the start of the second pass Viterbi operation, an ECCP, which could be the ECCP used in the first pass is used to obtain the soft symbol associated with each hard bit previously decoded in the first pass. Since the hard bits are already known from the first pass, it is not necessary for the ECCP to decode a received symbol set. Rather, the ECCP is used to compute the branch metrics associated with the previously decoded hard bits of the first pass. This is accomplished by operating the ECCP in its hard decoded state, as shown in block (401), with the traceback length set at zero. Consequently, at each time instant the branch metric corresponding to each previously decoded hard bit is obtained, while repeating the step of identifying the decoded hard bit is avoided.

The second pass viterbi operation proceeds as shown in block (402), where the ECCP is initialized with the accumulated cost values of the present states at the first time instant of interest. If soft symbol decoding is desired for the entire sequence of received symbol sets, then the second pass begins with the first received symbol set. However, with the present invention, it is possible to begin soft symbol decoding at some intermediate point. For example, if one hundred symbol sets were decoded during the first pass, but soft symbol decoding is only desired for the last twenty symbol sets, the ECCP is initialized for the second pass with the accumulated values of all the present states corresponding to the eighty-first received symbol set. The ability to start the second pass operation for soft symbol decoding at any time instant, has the added advantage of allowing the code rate or branch metric scheme, such as Manhattan or Euclidean, to change at any time instant.

The ECCP then receives the hard decoded output of the first pass, corresponding to the first time instant of interest, from which the ECCP can identify the most likely next state, as indicated by block (403). Branch metrics are then calculated in the DSP for the two transitions to a next state with the least error, as shown in block (404). Since the decoder knows the most likely next state and the accumulated costs of the present states, the accumulated cost values of both transitions at their corresponding next states can be updated, as shown in block (405). The absolute value of the accumulated cost difference between these two branches is computed and concatenated to the hard decoded output of the first pass operation, as shown in block (406).

At this point, the first received symbol of interest is loaded into the ECCP, as shown in block (407), in order to update the accumulated cost values of each of the next states, as shown in block (408). This step is necessary for subsequent soft symbol calculations, since the accumulated cost value difference at each time instant involves the most likely path, as well as all transitions leading to the most likely next states. In order to obtain the accumulated cost value of all these transitions at the next time instant, the cost values of all present states at each time instant must be known.

During the foregoing add-compare-select operation, the ECCP is set into background operation mode. Meanwhile the DSP performs other signal processing activities. After the ECCP completes its add-compare-select operation, it issues an interrupt to the DSP core. Alternatively, the DSP may poll an ECCP busy flag to determine when the ECCP completes its add-select-select operation. This is shown in blocks (409) and (410).

Figure 5:
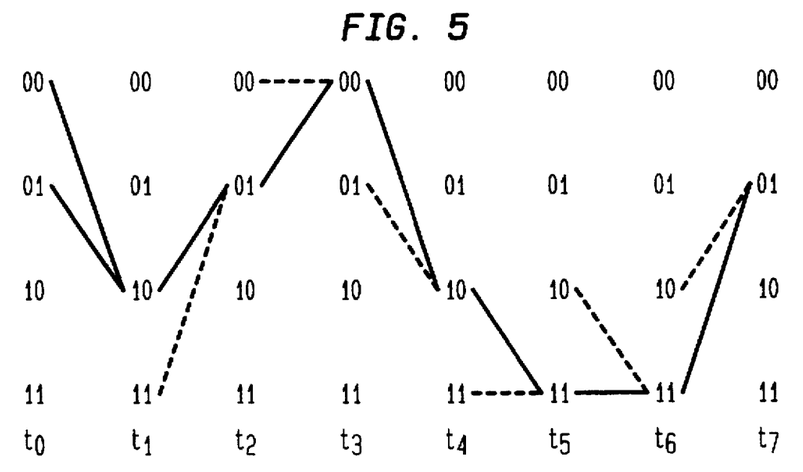
FIG. 5 is a trellis diagram of an illustration of the second pass Viterbi operation of the present invention.

Referring to FIG. 5, a trellis diagram is shown to further illustrate the second pass Viterbi operation of the present invention. The illustration assumes a rate one-half convolutional encoder, and the time instants are shown as instants $t_0$ through $t_7$. $t_0$ represents the time instant the first symbol set to be decoded for a soft symbol, is received. During the first pass of the Viterbi operation, the accumulated costs for each of the four possible states at time instant $t_0$ are saved. Assume that during the first pass at, $t_0$, the most likely next state was identified as 1,0 and that for $t_1$, through $t_7$, the hard decoded output comprises bits 1001110. Thus the only two possible state transitions from $t_0$ to $t_1$, to a most likely next state 1,0, involve present state 0,0 and 0,1. To obtain the soft symbol for the first hard bit 1, the decoder must compute the branch metrics for these two transitions, add them to the accumulated cost values of 0,0 and 0,1, at $t_0$, for the two updated accumulated cost values, and compute the absolute value of the accumulated cost difference. The most likely transitions for this example are shown in FIG. 5 as solid lines. The dashed lines indicate the alternate transitions leading to the most likely next state at each time instant, whose accumulated costs are used in computing the soft symbol.

Before the soft value for the next hard decoded bit is obtained, the decoder must update the accumulated cost values for all four states at $t_1$. At this point the next received symbol set can be reloaded and the foregoing steps repeated until soft symbols are obtained for each received symbol set for which soft symbols are desired, as shown in blocks (411) and (412).

The foregoing merely illustrates the principles of the present invention. Those skilled in the art will be able to devise various modifications, which although not explicitly described or shown herein, embody the principles of the invention and are thus within its spirit and scope.

What is claimed is:

1. A method for soft-symbol decoding a received set of digital signals, comprising the steps of:
   performing a first pass Viterbi operation on said set of digital signals for a hard bit decoded output; and
   using said hard bit decoded output indicating a best path estimate of said received set of digital signals, on which to performa second pass Viterbi operation for a soft symbol decoded output.

2. A method according to claim 1 wherein said set of digital signals is transmitted with one or more convolutional encoder code rates.

3. A method according to claim 1 wherein each of the first and second pass Viterbi operations involves calculating an error in a branch in accordance with one or more branch metric-type schemes.

4. A method according to claim 1 wherein each of said digital signals corresponds to one of a finite number of states representative of a source signal, and wherein said first pass Viterbi operation further comprises the steps of:

receiving each digital signal of said set of digital signals, in a discrete time instant;

mapping, at each of said time instants, all possible transitions from a present state of said finite number of states, to a finite number of next states;

calculating an accumulated cost value for each of said next states; and storing said accumulated cost value for each next state at one time instant prior to receiving a first digital signal for which soft symbol decoding is desired, as an initializing set of accumulated cost values.

5. A method according to claim 4 wherein said second pass Viterbi operation includes initializing a Viterbi decoder with said initializing set of accumulated cost values.

6. A method according to claim 5 wherein said second pass Viterbi operation further comprises the steps of:

receiving said hard decoded output of said first pass Viterbi operation;

determining at each time instant, a most likely next state from said hard decoded output, identifying, at each time instant, the two most likely branches which lead to said most likely next state;

calculating branch metrics for each of said two most likely branches leading to said most likely next state;

updating said accumulated cost values of said states leading to said most likely next state;

calculating the absolute value difference between said updated accumulated cost values;

coding said absolute value accumulated cost difference into a soft symbol for said hard decoded output of said first pass Viterbi operation corresponding to said time instant;

receiving at each time instant, a digital signal of said set of digital signals corresponding to said time instant; and updating said accumulated cost values for said finite number of next states.

7. A method according to claim 6 wherein said calculating branch metrics step is performed by a digital signal processor and said updating said accumulated cost values for each of said finite number of next states is performed by an error correcting co-processor.

8. A method according to claim 6 wherein said step of updating said accumulated cost values for said finite number of next states comprises the steps of:

calculating branch metrics for each possible transition between states at two consecutive time instants;

adding said branch metrics to said accumulated cost value at the earlier time instant; and selecting for each state of said finite number of states at the later time instant an accumulated cost value corresponding to a branch indicating a minimum error.

9. A circuit for soft-symbol decoding a received set of digital signals, comprising:

a Viterbi decoder for performing a first pass Viterbi operation on said set of digital signals for a hard bit decoded output; and a Viterbi decoder designed for a second pass Viterbi operation using said hard bit decoded output indicating a best path estimate of said received set of digital signals, for a soft symbol decoded output.

10. A circuit according to claim 9 fabricated as an integrated circuit.

11. A circuit according to claim 9 wherein said set of digital signals are transmitted with one or more convolutional encoder code rates.

12. A circuit according to claim 9 wherein said Viterbi decoder for performing a first pass Viterbi operation and said Viterbi decoder designed for a second pass Viterbi operation involve one or more branch metric schemes.

13. A circuit according to claim 9 wherein each of said digital signals corresponds to one of a finite number of states representative of a source signal, and wherein said Viterbi decoder for performing a first pass Viterbi operation further comprises:

a receiver for receiving each digital signal of said set of digital signals, in a discrete time instant;

means for mapping at each time instant, all possible transitions from a present state of said finite number of states, to a next state;

a computer processor for calculating an accumulated cost value for each of said next states;

data storage means for storing said accumulated cost for each next state at one time instant prior to receiving a first digital signal of said set of digital signals for soft symbol decoding, as an initializing set of accumulated cost values.

14. A circuit according to claim 13 wherein said Viterbi decoder designed for a second pass Viterbi operation includes means for initializing a Viterbi decoder with said initializing set of accumulated cost values.

15. A circuit according to claim 14 wherein said Viterbi decoder designed for a second pass Viterbi operation further comprises;

a receiver for receiving said hard decoded output of said first pass Viterbi operation;

means for determining, at each time instant, a most likely next state from said hard decoded output;

means for identifying, at each time instant, the two branches which lead to said most likely next state;

one or more computer processors for calculating branch metrics for each of said branches leading to said most likely next state for updating said accumulated cost values of said states leading to said most likely next state for calculating the absolute value difference between said updated accumulated cost values;

means for coding said absolute value accumulated cost difference into a soft symbol for said hard decoded output of said first pass Viterbi operation corresponding to said time instant; and means for updating said accumulated cost values for said finite number of next states.

16. A circuit according to claim 15 wherein said computer processor for calculating branch metrics is a digital signal processor and said means for updating said accumulated cost values for each of said finite number of next states is an error correcting co-processor.

17. A circuit according to claim 15 wherein said means for updating said finite number of next states with an accumulated cost value comprises:

one or more computer processors for calculating branch metrics for each possible transition between states at two consecutive time instants, for adding said branch metrics to said accumulated cost value at the earlier time instant, and for selecting for each state of said finite number of states at the later time instant an accumulated cost value corresponding to a branch indicating a minimum error.

* * * * *